(12) United States Patent
Khajehoddin et al.

(10) Patent No.: US 9,553,500 B2
(45) Date of Patent: Jan. 24, 2017

(54) INVERTER FOR A DISTRIBUTED POWER GENERATOR

(71) Applicant: SPARQ Systems Inc., Kingston (CA)

(72) Inventors: Ali Khajehoddin, Edmonton (CA); Praveen K. Jain, Kingston (CA); Alireza Bakhshai, Kingston, CA (US)

(73) Assignee: SPARQ Systems Inc., Kingston (CA)

( * ) Notice: Subject to any disclaimer, the term of this patent is extended or adjusted under 35 U.S.C. 154(b) by 132 days.

(21) Appl. No.: 14/173,439

(22) Filed: Feb. 5, 2014

(65) Prior Publication Data
US 2014/0192568 A1  Jul. 10, 2014

Related U.S. Application Data

(62) Division of application No. 12/709,166, filed on Feb. 19, 2010, now Pat. No. 8,670,249.
(Continued)

(30) Foreign Application Priority Data

Feb. 20, 2009 (CA) ..................................... 2655007

(51) Int. Cl.
H02M 1/12  (2006.01)
H02M 1/14  (2006.01)
(Continued)

(52) U.S. Cl.
CPC .................. *H02M 1/14* (2013.01); *G05F 1/67* (2013.01); *H01L 31/02021* (2013.01);
(Continued)

(58) Field of Classification Search
CPC .................. H02M 1/12; H02M 7/5395; H02M 2001/0022; H02M 1/14; H02M 1/15; H02J 3/01; Y02E 40/40
(Continued)

(56) References Cited

U.S. PATENT DOCUMENTS 6,091,612 A   7/2000  Blankenship
6,111,767 A   8/2000  Handleman
(Continued)

FOREIGN PATENT DOCUMENTS

GB   2434490 B       7/2007
JP   2003037939 A    2/2003
(Continued)

OTHER PUBLICATIONS

Meinhardt, M., et al., "Multi-string converter with reduced specific costs and enhanced functionality," Solar Energy, vol. 69, No. 1: 217-227 (2000).
(Continued)

*Primary Examiner* — Gary L Laxton
(74) *Attorney, Agent, or Firm* — Stephen J. Scribner

(57) ABSTRACT

Provided is a maximum power point (MPP) tracker for a PV cell inverter, and a PV cell inverter. The MPP tracker decouples output power oscillations from the input power generation and extracts maximum available power from the PV cell. The PV cell inverter uses the MPP tracker and generates a sinusoidal output current from the MPP tracker output. The sinusoidal output current may be fed to a power distribution grid. The PV cell inverter may use a pulse width modulation technique to cancel harmonics in the sinusoidal output current. The circuits use a minimum number of components and avoid use of large electrolytic capacitors.

24 Claims, 12 Drawing Sheets

Related U.S. Application Data

(60) Provisional application No. 61/202,355, filed on Feb. 20, 2009.

(51) Int. Cl.
*G05F 1/67* (2006.01)
*H01L 31/02* (2006.01)
*H02J 3/38* (2006.01)
*H02M 7/48* (2007.01)

(52) U.S. Cl.
CPC ............... *H02J 3/383* (2013.01); *H02M 7/48* (2013.01); *H02M 1/12* (2013.01); *Y02E 10/563* (2013.01); *Y02E 10/58* (2013.01)

(58) Field of Classification Search
USPC ........ 363/39, 40, 41, 78, 79, 80, 95, 97, 98, 363/131, 132; 323/266, 906
See application file for complete search history.

(56) References Cited

U.S. PATENT DOCUMENTS

| | | | |
|---|---|---|---|
| 6,147,478 | A | 11/2000 | Skelton et al. |
| 6,339,538 | B1 | 1/2002 | Handleman |
| 6,653,812 | B1* | 11/2003 | Huo .................. H02M 7/53875 318/801 |
| 7,031,176 | B2 | 4/2006 | Kotsopoulos et al. |
| 7,193,872 | B2 | 3/2007 | Siri |
| 7,256,566 | B2 | 8/2007 | Bhavaraju et al. |
| 7,324,361 | B2 | 1/2008 | Siri |
| 7,465,872 | B1 | 12/2008 | de Rooij et al. |
| 7,626,834 | B2 | 12/2009 | Chisenga et al. |
| 7,688,605 | B2 | 3/2010 | Garcia-Ortiz et al. |
| 8,670,249 | B2 | 3/2014 | Khajehoddin et al. |
| 2005/0139259 | A1 | 6/2005 | Steigerwald et al. |
| 2005/0286281 | A1 | 12/2005 | Victor et al. |
| 2006/0055366 | A1 | 3/2006 | Tsunetsugu et al. |
| 2006/0132102 | A1 | 6/2006 | Harvey |
| 2007/0179720 | A1 | 8/2007 | Becker et al. |
| 2007/0297206 | A1 | 12/2007 | Cramer et al. |
| 2008/0055941 | A1 | 3/2008 | Victor et al. |
| 2008/0094860 | A1 | 4/2008 | Falk |
| 2008/0149167 | A1 | 6/2008 | Liu |
| 2008/0205096 | A1 | 8/2008 | Lai et al. |
| 2008/0266922 | A1 | 10/2008 | Mumtaz et al. |
| 2010/0208501 | A1* | 8/2010 | Matan ...................... H02J 3/18 363/95 |
| 2011/0130889 | A1 | 6/2011 | Khajehoddin et al. |
| 2011/0261593 | A1 | 10/2011 | Pan et al. |
| 2011/0264288 | A1 | 10/2011 | Khajehoddin et al. |

FOREIGN PATENT DOCUMENTS

| | | |
|---|---|---|
| WO | WO 03/036688 A2 | 5/2003 |
| WO | WO 2004/107543 A2 | 12/2004 |
| WO | WO 2006/048688 A1 | 5/2006 |
| WO | WO 2006/048689 A2 | 5/2006 |
| WO | WO 2006/125409 A2 | 11/2006 |
| WO | WO 2007/080429 A2 | 7/2007 |

OTHER PUBLICATIONS

Kjaer, S. et al., "A review of single-phase grid-connected inverters for photovoltaic modules," IEEE Transactions on Industry Applications, vol. 41, No. 5: 1292-1306, Sep./Oct. 2005.

Walker, G. et al., "Cascaded DC/DC converter connection of photovoltaic modules," IEEE Transactions on Power Electronics, vol. 19.: 1130-1139 (2004).

Esram, T. et al., "Comparison of photovoltaic array maximum power point tracking techniques" IEEE Transactions on Energy Conversion, vol. 22, No. 2; 439-449, Jun. 2007.

Xue, Y. et al., "Topologies of single-phase inverters for small distributed power generators: an overview," IEEE Transactions on Power Electronics, vol. 19, No. 5: 1305-1314, Sep. 2004.

Shimizu, T. et al., "A flyback-type single phase utility interactive inverter with low-frequency ripple current reduction on the DC input for an AC photovoltaic module system," Power Electronics Specialists Conference, pesc 02. IEEE 33rd Annual, vol. 3: 1483-1488 (2002).

Kjaer, S. et al., "Design optimization of a single phase inverter for photovoltaic applications," Power Electronics Specialist Conference, PESC 03 IEEE 34th Annual, vol. 3: 1183-1190, Jun. 2003.

Ho, B. et al., "An integrated inverter with maximum power tracking for grid-connected PV systems," IEEE Transactions on Power Electronics, vol. 20, No. 4: 953-962, Jul. 2005.

Jain, S., et al., "New current control based MPPT technique for single stage grid connected PV systems," Energy Conversion and Management, vol. 48: 625-644 (2007).

Akkaya, R. et al., "A microcontroller-based stand-alone photovoltaic power system for residential appliances," Applied Energy, vol. 78: 419-431 (2004).

Shinjo, F., et al., "A single-phase grid-connected inverter with a power decoupling function," Power Electronics Specialists Conferences, PESC 2007 IEEE: 1245-1249 (2007).

Prasad, B., et al., "Universal single-stage grid-connected inverter," IEEE Transactions on Energy Conversion, vol. 23, No. 1: 128-137, Mar. 2008.

Third-Party Submission in Published Application for U.S. Appl. No. 12/709,166.

\* cited by examiner

INVERTER FOR A DISTRIBUTED POWER GENERATOR

RELATED APPLICATIONS

This application is a division of U.S. patent application Ser. No. 12/709,166, filed on Feb. 19, 2010, and claims the benefit of the filing date of U.S. Provisional Patent Application No. 61/202,355, filed on Feb. 20, 2009, the contents of which are incorporated herein by reference in their entirety.

FIELD OF THE INVENTION

This invention relates to circuits, systems, and methods for obtaining power from a distributed power generator such as a photovoltaic cell, and for interfacing a distributed power generator to a power distribution grid. In particular, this invention relates to a maximum power point tracker and a string/multi-string photovoltaic cell inverter incorporating the maximum power point tracker.

BACKGROUND OF THE INVENTION

Grid-connected distributed power generators such as photovoltaic (PV) systems typically consist of two major parts: PV cell arrays to convert irradiation to electrical energy, and an inverter to feed the electrical energy into a power distribution grid. PV cell configurations may be categorized according to four groups [1]: centralized, string, multi-string, and AC-module and AC-cell technologies, see FIG. 1(a). All approaches have advantages and disadvantages [1], [2], and compromise various attributes such as harmonic rejection capability, simplicity, efficiency, flexibility, reliability, safety, modularity, and cost.

The centralized topology is considered the best for high power applications because the input power level can be increased, and it uses only one inverter which increases the conversion efficiency. However, this topology has limitations. For example, since there is significant high voltage DC wiring between the PV cells and the inverter, the topology requires expensive DC switches and special isolation, safety, and protection circuits. Due to the centralized maximum power point tracking (MPPT), partial shading of the PV cells or any mismatch between the PV cells causes a significant drop in the output power generation.

For medium power applications, the most suitable configuration is considered to be the string or multi-string technologies, [3], where one or more strings of PV cells are connected to a single inverter, as shown in FIG. 1(b). Unlike the centralized configuration, this type of configuration enables independent MPPT for all strings which might be installed in different sizes and orientations. This also increases the overall efficiency under certain circumstances, such as partial shadowing of the PV cells. Therefore, this topology offers the flexibility to optimize the number of strings and inverters for the specific application power level to increase the overall efficiency and to reduce losses.

Since the PV cell array current-voltage characteristic is highly nonlinear, the MPPT of PV cell arrays is challenging. MPPT systems usually consist of two parts; MPP tracker hardware, and an algorithm. The MPP tracker alters the input resistance of the inverter seen from the output terminal of the PV cells that results in a change of the operating point. MPPT algorithms [4] calculate the best operating point available based on the current irradiation and temperature of the PV cells and provide a reference point for the MPP tracker hardware.

In single-phase or unbalanced three phase grid-connected systems, the instantaneous power injected to the grid oscillates at twice the grid frequency. One of the MPP tracker tasks is to decouple the power oscillation from the PV cells, because the oscillation results in a deviation from the optimum operating point of the PV cells [2], [5]. This problem is usually resolved by connecting a large electrolytic capacitor at the PV cell terminals, which in turn decreases the lifetime and increases the volume, weight, and cost of the inverter. To avoid the electrolytic capacitor, an auxiliary circuit may be used [6], [7] which draws constant current from the input and generates a high DC voltage at the middle stage to supply the pulsation required at the output. In [8], an auxiliary circuit was proposed with a transformer and passive and active components to avoid oscillation. However, such solutions have low efficiency and have complex hardware and control systems, which make the overall system expensive.

SUMMARY OF THE INVENTION

Described herein is a maximum power point (MPP) tracker topology which decouples output power oscillations from the PV cell power generation. The topology may extract the maximum available power from each PV cell string of a multi-string system independently. The circuit uses a minimum number of components and avoids the use of large electrolytic capacitors, which is a major factor in limiting circuit life time. The MPP tracker is not limited to low-power applications. Such decoupling, described herein, is applicable to voltage source converter topologies and current source converter topologies.

One embodiment provides a maximum power point (MPP) tracker for a photovoltaic cell, comprising: high side and low side input points for the photovoltaic cell; a capacitor connected across the high side and low side input points; a switch connected between the high side input point and a node; an inductor connected between the node and a high side output point; a unidirectional conducting device connected between the node and the low side; a low side output point; and a maximum power point (MPP) tracker controller; wherein the switch controls the voltage across the capacitor. The capacitor voltage may be controlled between a lower limit and an upper limit.

Another embodiment provides a maximum power point (MPP) tracker for a photovoltaic cell, comprising: high side and low side input points for the photovoltaic cell; a series input inductor connected to the high side input point; a switch connected between the series input inductor and a node; an output inductor connected between the node and a high side output point; a unidirectional conducting device connected between the node and the low side; a low side output point; and a maximum power point (MPP) tracker controller; wherein the switch controls the current through the inductor. The inductor current may be controlled between a lower limit and an upper limit.

Also described herein is a PV cell inverter using a current source (e.g., buck-boost) topology in which the output voltage may be greater or smaller than the voltage of the input PV cell. Unlike voltage source topologies, the inverter directly generates and feeds the desired current into the grid using a modified pulse width modulation (PWM) technique. The modified PWM technique and control strategy optimize the middle stage dc current level in the inverter. This results in a flatter efficiency curve for a wide range of input power. The PV cell may comprise a string of multiple PV cells, or multiple strings of PV cells.

Also described herein is an inverter for a photovoltaic cell, comprising: an MPP tracker as described above; and a means for generating a sinusoidal output current from the MPP tracker output.

The means for generating a sinusoidal output current may comprise a current source inverter or a voltage source inverter. In one embodiment, the means for generating a sinusoidal. output current may comprise a pulse width modulator. The means for generating a sinusoidal output current may comprise a means that modifies a pulse width modulation reference signal to cancel harmonics in an output current of the inverter. The means that modifies a pulse width modulation reference signal may comprise a PI controller and a compensator.

Also described herein is a method of applying a maximum power point tracker to a photovoltaic cell, comprising: connecting the output voltage of the photovoltaic cell across a capacitor; maintaining voltage across the capacitor between a lower limit and an upper limit to produce output power; wherein the upper limit is a reference voltage; wherein the lower limit is a function of a selected switching frequency of a switching circuit and an output current of the photovoltaic cell; wherein the output power is the maximum power available from the photovoltaic cell at a given instant in time.

The method may comprise connecting the output voltage of a string of two or more photovoltaic cells across the capacitor. The method may comprise using a switching circuit to maintain the voltage across the capacitor.

Another aspect relates to a method for obtaining power from a photovoltaic cell, comprising: using the maximum power point tracker with the photovoltaic cell and producing output power according to the method described above; and generating a sinusoidal output current from the output power.

The method may comprise using pulse width modulation (PWM) to generate the sinusoidal output voltage or current. The method may comprise using pulse width modulation to cancel a harmonic in the output voltage or current. Generating a sinusoidal output current may comprise using a current source inverter or a voltage source inverter. The method may comprise connecting the sinusoidal output current to a power distribution grid. The method may comprise connecting the output voltage of a string of two or more photovoltaic cells across the capacitor.

Another aspect relates to a method for obtaining power from a plurality of photovoltaic cells, comprising: tracking the maximum power point of each photovoltaic cell and producing output power from each photovoltaic cell using the method described above; and generating a sinusoidal output current from the output power.

Also described herein is a method for obtaining power from a plurality of photovoltaic cells, comprising: using a maximum power point tracker with each string of photovoltaic cells or modules and producing output power from each string of photovoltaic cells or modules according to the method of described above; and generating a sinusoidal output current from the output power.

Also described herein is a method of cancelling a harmonic in an output voltage or current of a circuit, comprising using a PWM technique. Using a PWM technique may comprise using a modified PWM technique. The modified PWM technique may comprise modifying a PWM reference signal to increase or decrease output current and power of the circuit. The harmonic may be related to an oscillation of an input voltage or current of the circuit. The circuit may be a current source inverter or a voltage source inverter.

Also described herein is a PV cell system for connecting PV cells to a power distribution grid, comprising a PV cell inverter as described herein and one or more PV cells.

The topologies described herein accept low PV cell voltages at the input, which increases efficiency in partial shading conditions, compared to topologies in which many PV cells are connected in series to build up a high input voltage.

Also described herein is a circuit for use with a distributed power generator, comprising: a high side input point and a low side input point for the distributed power generator; a high side output point and a low side output point; and (i) a parallel input capacitor; and a means that regulates voltage across the capacitor; wherein regulating voltage across the capacitor substantially removes distributed power generator input voltage oscillation; or (ii) a series input inductor; and a means that regulates current through the series input inductor; wherein regulating current through the series input inductor substantially removes distributed power generator input current oscillation.

The voltage across the capacitor may be regulated between a lower limit and an upper limit. The means that regulates voltage across the capacitor may comprise a switch connected between the high side input point and a node; an output inductor connected between the node and the high side output point; and a diode connected between the node and the low side output point. The upper limit may be a reference voltage and the lower limit may be calculated so that a switching frequency of the switch and the distributed power generator input voltage oscillation or input current oscillation do not exceed selected values. The reference voltage may be obtained from a maximum power point tracking (MPPT) algorithm. The circuit may include a controller for the switch. The controller may be a hysteresis controller.

The current through the series input inductor may be regulated between a lower limit and an upper limit. The means that regulates current through the series input inductor may comprise: a switch connected between the series input inductor output and the low side input point; and a diode connected in series between the series input inductor and the high side output point. The upper limit may be a reference current and the lower limit may be calculated so that a switching frequency of the switch and the distributed power generator input current oscillation do not exceed selected values. The reference current may be obtained from a maximum power point tracking (MPPT) algorithm. The circuit may include a controller for the switch. The controller may be a hysteresis controller.

Also described herein is an inverter for a distributed power generator, comprising: the circuit described above; and a means that generates a sinusoidal output current from the circuit output. In one embodiment of the inverter, (i) the circuit includes a parallel input capacitor and a means that regulates voltage across the capacitor, and the inverter comprises a current source inverter; or (ii) the circuit includes a series input inductor and a means that regulates current through the series input inductor, and the inverter comprises a voltage source inverter.

Also described herein is a compensator for use with a voltage source inverter or a current source inverter, wherein the compensator modifies a pulse width modulation (PWM) reference signal of the voltage source inverter or current source inverter, to cancel one or more harmonic in the voltage source inverter or current source inverter output current.

Also described herein is an inverter as described above, including a compensator, wherein the compensator modifies a pulse width modulation (PWM) reference signal of the voltage source inverter or the current source inverter, to cancel one or more harmonic in the voltage source inverter or current source inverter output current.

Also described herein is a method for obtaining power from a distributed power generator, comprising: (i) connecting a capacitor across the output voltage of the distributed power generator; and actively regulating voltage across the capacitor; wherein regulating voltage across the capacitor substantially removes distributed power generator voltage oscillation; or (ii) connecting a series input inductor to the output of the distributed power generator; and actively regulating current through the inductor; wherein regulating current through the inductor substantially removes distributed power generator current oscillation.

The method may comprise: (i) using a switch to regulate the voltage across the capacitor; or (ii) using a switch to regulate the current through the inductor. The method may include regulating the voltage across the capacitor between an upper limit and a lower limit. The upper limit may be a reference voltage and the lower limit may be calculated so that a switching frequency of the switch and the distributed power generator input voltage oscillation or input current oscillation do not exceed selected values. The method may include using hysteresis to control the switch.

Also described herein is a method for obtaining power from a distributed power generator and producing a sinusoidal output current, comprising: (i) connecting a capacitor across the output voltage of the distributed power generator; actively regulating voltage across the capacitor to substantially remove distributed power generator voltage oscillation; and using a current source inverter to produce the sinusoidal output current; or (ii) connecting a series input inductor to the output of the distributed power generator; actively regulating current through the inductor to substantially remove distributed power generator current oscillation; and using a voltage source inverter to produce the sinusoidal output current.

The method may further comprise connecting the sinusoidal output voltage or current to a power distribution grid.

Also described herein is a method of obtaining power from voltage source inverter or a current source inverter, comprising modifying a pulse width modulation (PWM) reference signal of the voltage source inverter or current source inverter to cancel one or more harmonic in the voltage source inverter or current source inverter output current. The method may further comprising modifying a pulse width modulation (PWM) reference signal of the voltage source inverter or current source inverter to cancel one or more harmonic in the voltage source inverter or current source inverter output current.

In the above embodiments, the distributed power generator may be a wind turbine or a photovoltaic cell.

BRIEF DESCRIPTION OF THE DRAWINGS

For a better understanding of the invention, and to show more clearly how it may be carried into effect, embodiments will now be described, by way of example, with reference to the accompanying drawings, wherein.

DETAILED DESCRIPTION OF EMBODIMENTS

Described herein are systems, circuits, and methods for obtaining power from a distributed power generator, the obtained power being suitable for injection into a power distribution grid. A distributed power generator may be, for example, a wind turbine or a photovoltaic cell. Whereas embodiments of the systems, circuits, and methods are described herein primarily with respect to photovoltaic cells, it will be appreciated that the systems, circuits, and methods are not limited thereto.

Figure 1B:
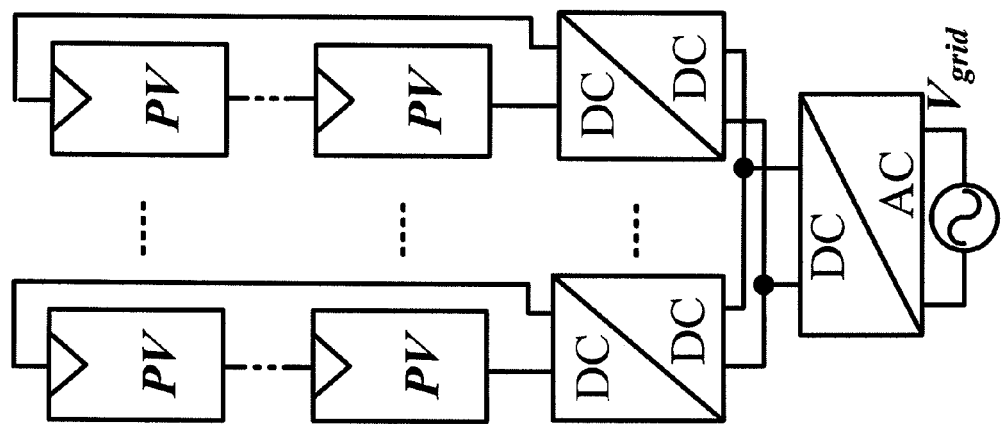
FIG. 1B shows a block diagram of a multi-string PV cell inverter configuration, according to the prior art.
Figure 1A:
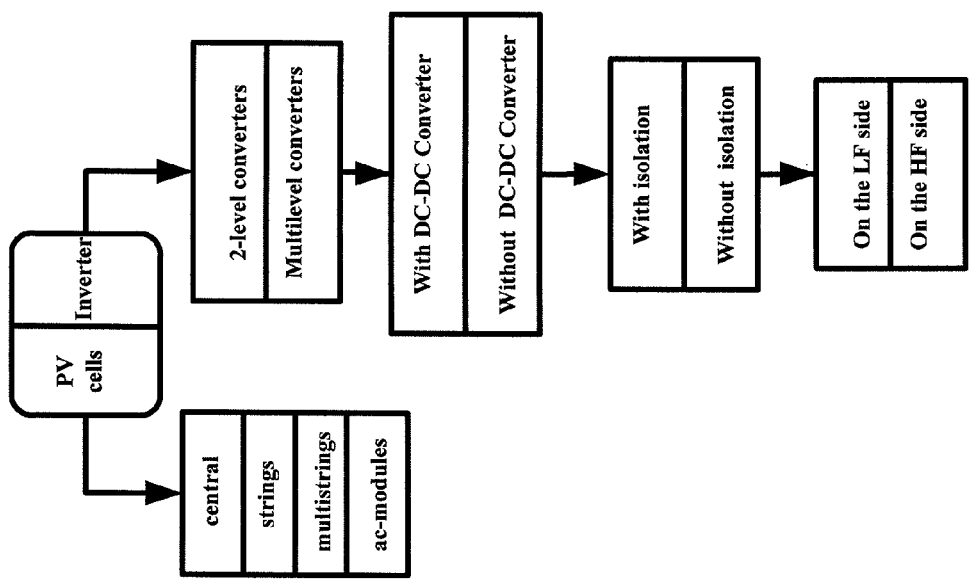
FIG. 1A shows a block diagram of PV cell systems categorized by different PV cell configurations and inverter types, according to the prior art.
Figure 2:
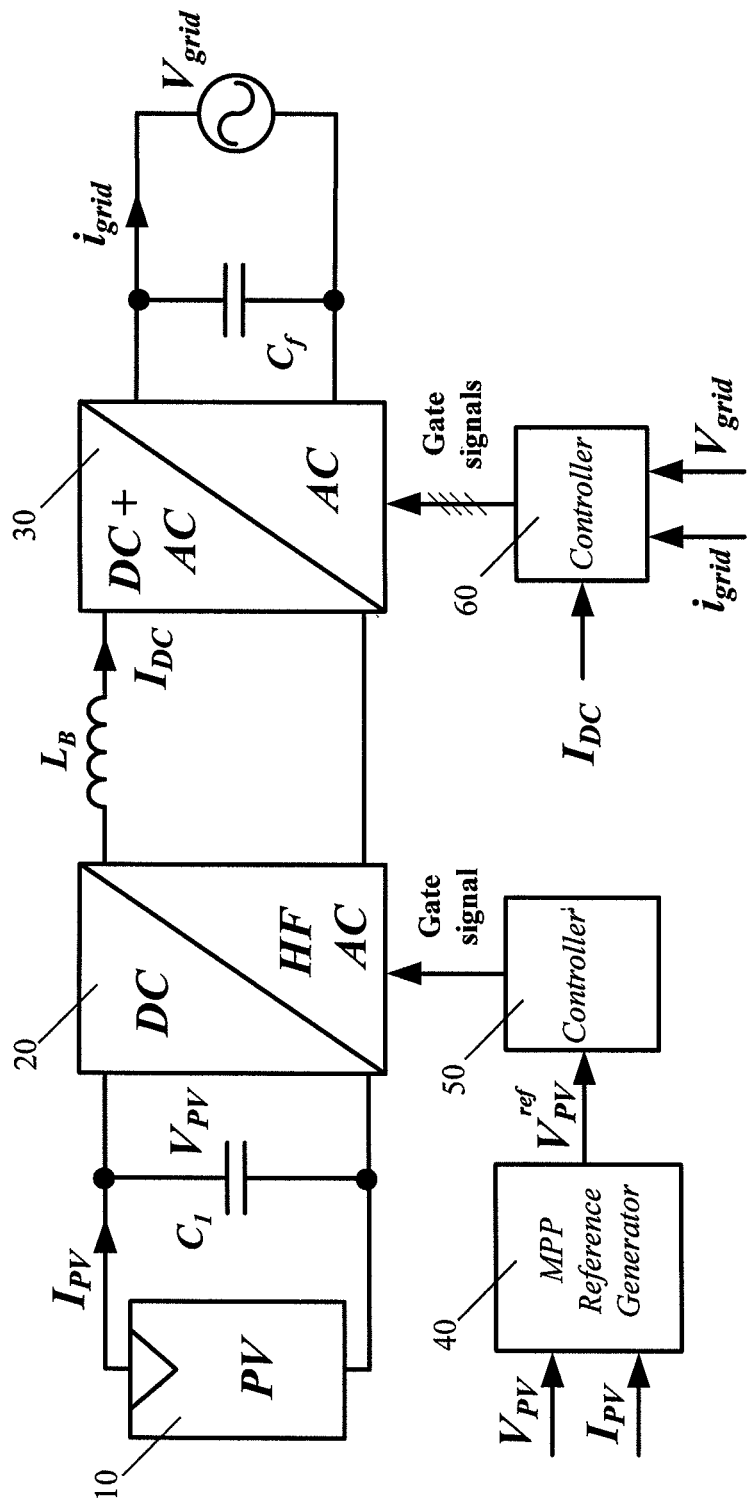
FIG. 2 is a generalized block diagram of a PV cell inverter according to an aspect of the invention.

For example, described herein is an inverter for obtaining power from one or more photovoltaic cells. In one embodiment, the inverter is for interfacing one or more PV cells to a power distribution grid. Such an embodiment is shown in FIG. 2. This embodiment includes an input capacitor $C_1$ connected across the PV cell(s) 10, a first stage including an MPP tracker circuit 20 connected across the input capacitor, and a series inductor $L_B$ connected to the MPP tracker output, and a second stage including an output inverter, and an output capacitor $C_{AC}$. The first stage also includes a controller 50 for the MPP tracker circuit 20, and a circuit 40 to generate a reference voltage. With the controller 20, the MPP tracker circuit 20 controls the voltage across the input capacitor $C_1$. The second stage also includes a controller 60 for the inverter 30.

Features of the PV inverter embodiments described herein include: a low PV cell voltage is accepted, which improves efficiency at partial shading conditions of the PV cells; a wide range of input voltage is accepted; adaptive control of the inductor $L_B$ current DC level optimizes the modulation index for the inverter over a wide range of input power levels; input and output power decoupling are provided with only a small input capacitor $C_1$; a fast MPP tracker; and integration of the MPP tracker into a PV cell array is possible because no passive component is required for the input of the MPP tracker stage. These features will be described in detail below.

As used herein, the terms "maximum power point tracking (MPPT)" and "maximum power point tracker (MPP tracker)" are distinct. "MPPT" refers to an algorithm and "MPP tracker" refers to hardware (i.e., a circuit). The MPPT calculates the optimum operating point for a distributed power generator such as a photovoltaic cell, and provides a reference point for MPP tracker to steer the system toward the optimum operating point.

As used herein, the term "photovoltaic cell" refers to any cell having a light absorbing material to absorb photons and generate electrons via a photoelectric effect. A non-limiting example of a photovoltaic cell is a solar cell. The light absorbing material may absorb light in any wavelength or combination of wavelengths, including, for example, wavelengths of solar light that reach the earth's surface, and/or wavelengths of solar light beyond the earth's atmosphere. Two or more light absorbing materials having specific wavelengths of light absorption may be used in combination to take advantage of different light absorption and charge separation mechanisms. The light absorbing material may be configured as, for example, bulk material, thin-film (e.g., inorganic layers, organic dyes, and organic polymers), and/or nanocrystals. The photovoltaic cells may be combined into arrays, strings, or panels.

As used herein, the term "photovoltaic cell string" refers to a plurality of photovoltaic cells connected together in a series, parallel, series-parallel, or other configuration.

Power Decoupling

The instantaneous output power oscillates at twice the grid frequency in single-phase grid-connected systems. In PV systems, the input power generation is dc and thus the oscillation of the instantaneous output power, if reflected in the input, causes the input operating point to deviate from dc. If there is power oscillation on the PV side, maximum power is only achievable at the peak of oscillation, which translates into less average power extraction than the available maximum power. This is a power loss that reduces the efficiency of the PV system. Substantially the same problem exists in systems with wind turbines or fuel cells at the input for single phase systems or unbalanced three phase systems. Therefore, power oscillation is a key problem in such systems and the converter should decouple the output power oscillation from the input dc power generation to maximize efficiency. Power decoupling is conventionally performed by using large electrolytic capacitors in the design to minimize the effect of the output power oscillation on the input operating point. However, use of large capacitors lowers the reliability of the hardware, resulting in high maintenance expenses.

Conventional approaches use a control system to regulate the average of the input voltage or current to achieve maximum power point tracking and to reach sufficient amplification gain. In such approaches decoupling is accomplished by either passive elements or auxiliary power circuits.

In contrast, the maximum power point tracker described herein forces the input voltage or current to track a reference signal very tightly. As a result, the double frequency oscillation is displaced and the input power generation is at or very close to the optimum dc level.

Power decoupling as described herein may be implemented using a closed loop control system with high bandwidth, such as, for example, a hysteresis controller, or an open loop control system having high gain at the frequency of the oscillatory harmonic. That is, although the operating point of the converter oscillates at twice the grid frequency, the converter should respond with sufficient speed to reject the effect of this distortion from the power generation (e.g., PV) side.

The high open loop gain or closed loop bandwidth of the system will eventually cause very low or zero steady state error with fast tracking of the input reference point. As a result, input power decoupling is accomplished only by means of the control strategy and/or the high switching frequency, rather than methods that use bulky passive elements or auxiliary circuits. For example, a high switching frequency converter at the PV side as described herein can remove the oscillatory harmonics at the input. Power decoupling may also be accomplished using a resonant controller tuned at the oscillatory harmonic to generate high open loop gain at the PV side converter.

MPP Tracker

Figure 3B:
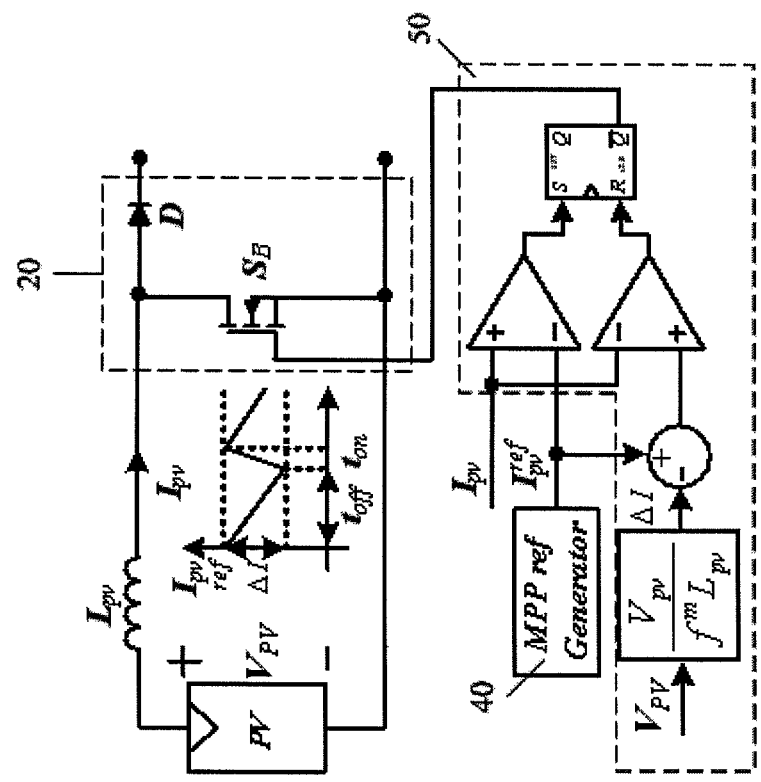
FIG. 3B is a schematic diagram of a maximum power point tracker circuit and a controller according to another embodiment. The inset plot of $I_{pv}$ as a function of time shows operation of the main switch $S_B$ according to the embodiment.
Figure 3A:
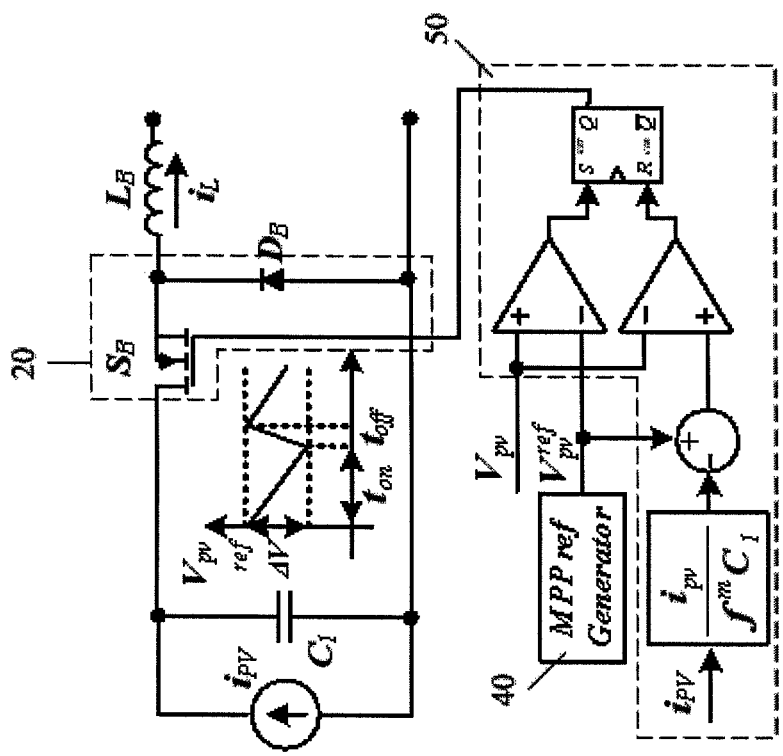
FIG. 3A is a schematic diagram of a maximum power point tracker circuit and a controller according to one embodiment. The inset plot of $V_{pv}$ as a function of time shows operation of the main switch $S_B$ according to one embodiment.

FIG. 3A is a schematic diagram of an MPP tracker circuit 20, and its controller 50 and reference voltage circuit 40, according to one embodiment. The inset plot of $V_{pv}$ as a function of time shows an embodiment of a control strategy for this circuit. Other control strategies may also be used. In the embodiment shown in FIG. 3A, the MPP tracker circuit includes a series switch $S_B$ connected to the high side input terminal and a unidirectional conducting device such as a diode $D_B$ connected between the switch output and the low side input terminal. In operation, the main switch $S_B$ is used to regulate the input capacitor $C_1$ voltage. Regulating the input voltage enables the inverter to displace output power oscillation from the input terminal, substantially removing PV cell voltage oscillation and avoiding the need for large input capacitors at the PV terminals. Removal of the input voltage oscillation stabilizes the input operating point, resulting in high efficiency conversion with much smaller capacitors.

FIG. 3B is a schematic diagram of an MPP tracker circuit 20, and its controller 50 and reference voltage circuit 40, according to another embodiment. The inset plot of $I_{pv}$ as a function of time shows an embodiment of a control strategy for this circuit. Other control strategies may also be used. In the embodiment shown in FIG. 3B, the MPP tracker circuit includes a series input inductor $L_{pv}$, a switch $S_B$, and a unidirectional conducting device such as a diode D connected in series with the high side output terminal. In operation, the main switch $S_B$ is used to regulate the current through the inductor $L_{pv}$. Regulating the inductor current enables the inverter to displace output power oscillation from the input terminal, substantially removing PV cell voltage oscillation and avoiding the need for large input capacitors at the PV terminals. Removal of the input current oscillation stabilizes the input operating point, resulting in high efficiency conversion with much smaller capacitors.

Figure 3C:
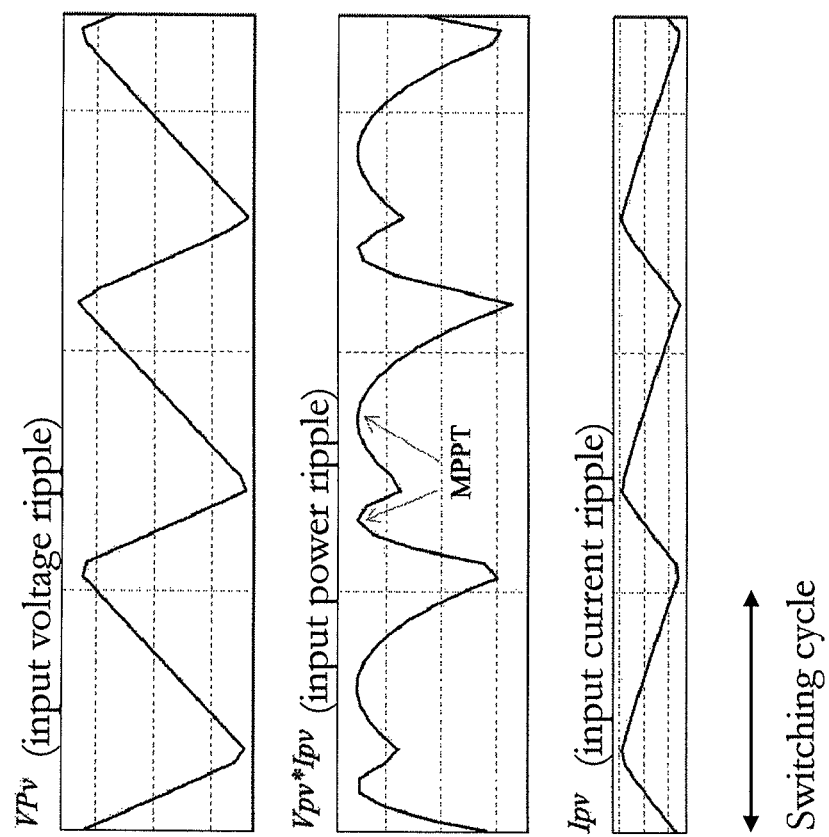
FIG. 3C shows only the ripple of the PV cell voltage, power, and current waveforms during three switching cycles of the embodiment of FIG. 3A.

FIG. 3C shows the ripple of the input voltage, power, and current waveforms from the PV cells, for the embodiment of FIG. 3A. A typical PV cell i-v characteristic curve includes three operating conditions: 1) operation at a voltage lower than the optimum point where the PV cell voltage is increased and the power is increased; 2) operation at a voltage higher than the optimum point where the PV cell voltage is increased and the power is decreased; and 3) operation around the optimum point where the PV voltage is increased and the power is maximum, where the MPP is tracked. It is clear from FIG. 3B that the MPP is tracked since during the rise time of the PV cell voltage, the output power reaches its maximum. The control strategy of the above MPP tracker embodiment may accept a reference voltage from any MPP tracking algorithm (such as, for example, a perturb/observe algorithm), to obtain the maximum power available from the PV cells independent of the output voltage and current. The power is delivered to the inverter stage 30 and, as described below, the output current and voltage of the MPP tracker are controlled and induced by the inverter stage. This topology may provide power to any load or inverter configuration (e.g., voltage source inverter, current source inverter) at the next stage.

Figure 4A:
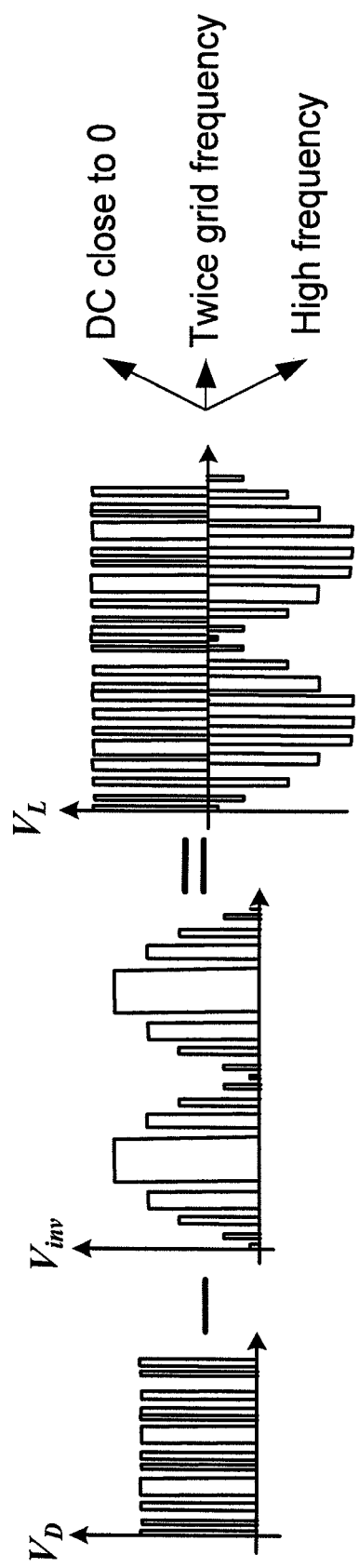
FIGS. 4A and 4B show voltage and current waveforms for the inductor $L_B$ in the embodiment of FIG. 3A.
Figure 4B:
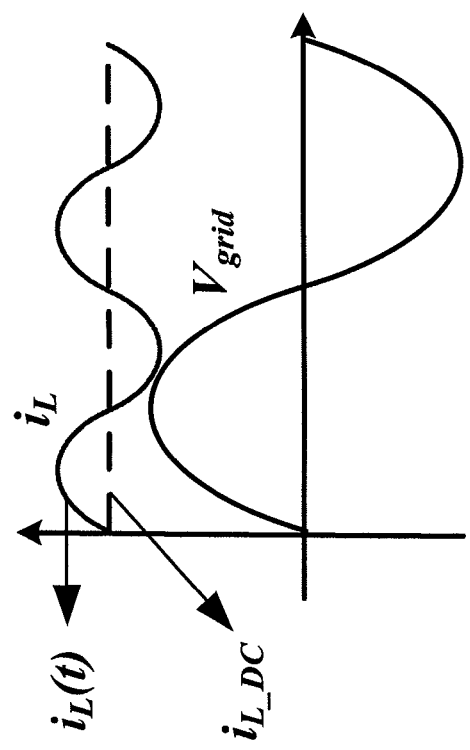

As shown in FIG. 4A, the output of the switch $S_B$ is a high frequency oscillating voltage $V_D$. However, the input of the inverter 30 is a low frequency (e.g., twice the grid frequency, 120 Hz) oscillating voltage $V_{inv}$. The current in the inductor $L_B$ includes dc, an oscillating current at twice the grid frequency, and high frequency harmonics. Therefore, as shown in FIG. 4B, the inductor current includes a double grid frequency harmonic that should not be injected to the output grid current. in one embodiment, described below, the double grid frequency harmonic is removed using a modified pulse width modulation (PWM) strategy.

Control Strategy for MPP Tracker

An embodiment of the input capacitor $C_1$ voltage control may be briefly described as follows. The capacitor voltage $V_{pv}$ is maintained between two upper and lower levels. This is done by the hysteresis control strategy as shown in FIG. 3A. The controller may be implemented with two comparators and two comparison levels. The upper level, $V_{pv}^{ref}$, may be obtained from an MPPT algorithm. The lower level, $V_{pv}^{ref} - \Delta V_{pv}$, is not constant and is calculated in such a way that for all conditions, the switching frequency and the voltage ripple do not exceed selected values. This will be shown below. When the input capacitor voltage $V_{pv}$ exceeds the upper level, the output of the upper comparator becomes high, the flip-flop is set, which turns the main switch $S_B$ on, and discharges the capacitor. The switch remains on until the flip-flop is reset when the capacitor voltage hits the lower limit.

In summary, the controller maintains the PV cell voltage very close to the optimum reference point provided by the MPPT algorithm. Since the level of the input voltage is proportional to the power generation, by controlling the input voltage the power fed to the circuit is controlled and this stage becomes a controllable power source. For example, if the output of this stage was connected to a heater (e.g., a resistor), the heat transfer would be linearly controlled by the input reference voltage.

The capacitor value and $\Delta V_{pv}$ may be selected such that the operating frequency of the circuit is always less than a certain limit and the voltage ripple is less than %8.5$V_{pv}^{MPP}$ in order to reach a utilization ratio higher than %98. Any ripple at the PV cell voltage decreases the efficiency (or utilization ratio), because the maximum power is extracted when the voltage is equal to $V_{pv}^{MPP}$, and any deviation due to the voltage ripple decreases the output power.

During the time that the switch $S_B$ is off the following relationship is valid:

$$\Delta Q = C \Delta V_{pv} = i_{pv} t_{off} \Rightarrow \Delta V_{pv} = \frac{i_{pv}}{C_1 f}, f = \frac{1}{t_{off}} \quad (1)$$

To limit the switching frequency, f is restricted because $$f_{S = \frac{1}{t_{off} + t_{on}}} < f.$$

The equation above shows that $$f = \frac{i_{pv}}{C_1 \Delta V_{pv}}.$$

By substitution it can be shown that if $\Delta V_{pv}$ is chosen as $$\frac{i_{pv}}{C_1 f^m},$$

for all conditions the time off will be almost constant because $$\frac{1}{t_{off}} = f = f^m,$$

where $f^m$ is the maximum frequency.

The voltage of the PV cells is minimized, i.e., $V_{min}^{MPP}$, at the lowest operating temperature. As mentioned above, it is desired that $\Delta V_{pv} < \%8.5 V_{pv}^{MPP}$. Therefore, this inequality holds true for all conditions if $\Delta V_{pv} < \%8.5 V_{min}^{MPP}$.

From (1) and the above inequality it can be shown that $$\frac{i_{pv}}{C_1 f^d} < \% \, 8.5 \, V_{min}^{MPP}.$$

For this inequality to be true for all conditions, the left hand side is maximized to calculate the capacitor value. The maximum value of the PV cells $i_{max}^{MPP}$ is known and occurs at irradiation. As a result, the input capacitor $C_1$ value may be determined as:

$$C_1 = \frac{i_{max}^{MPP}}{\% \, 8.5 \, V_{min}^{MPP} f^m}$$

It is clear from the above equation for $C_1$ that in obtaining a desired PV voltage variation, there is a trade-off between the switching frequency and the capacitor value. If the parameters are chosen in this way, this control scheme provides that for all irradiation and temperature levels the circuit operates below the selected desired frequency and the above %98 utilization ratio. For example, if $i_{pv}^{max} = 4$ A, $V_{min}^{MPP}$=100 V, and f'''=20 KHz, the capacitor will be $C_1$=20 µF, where the PV cell voltage variation is selected to be $\Delta V_{pv}$=5V.

Current Source PV Cell Inverter

Figure 5A:
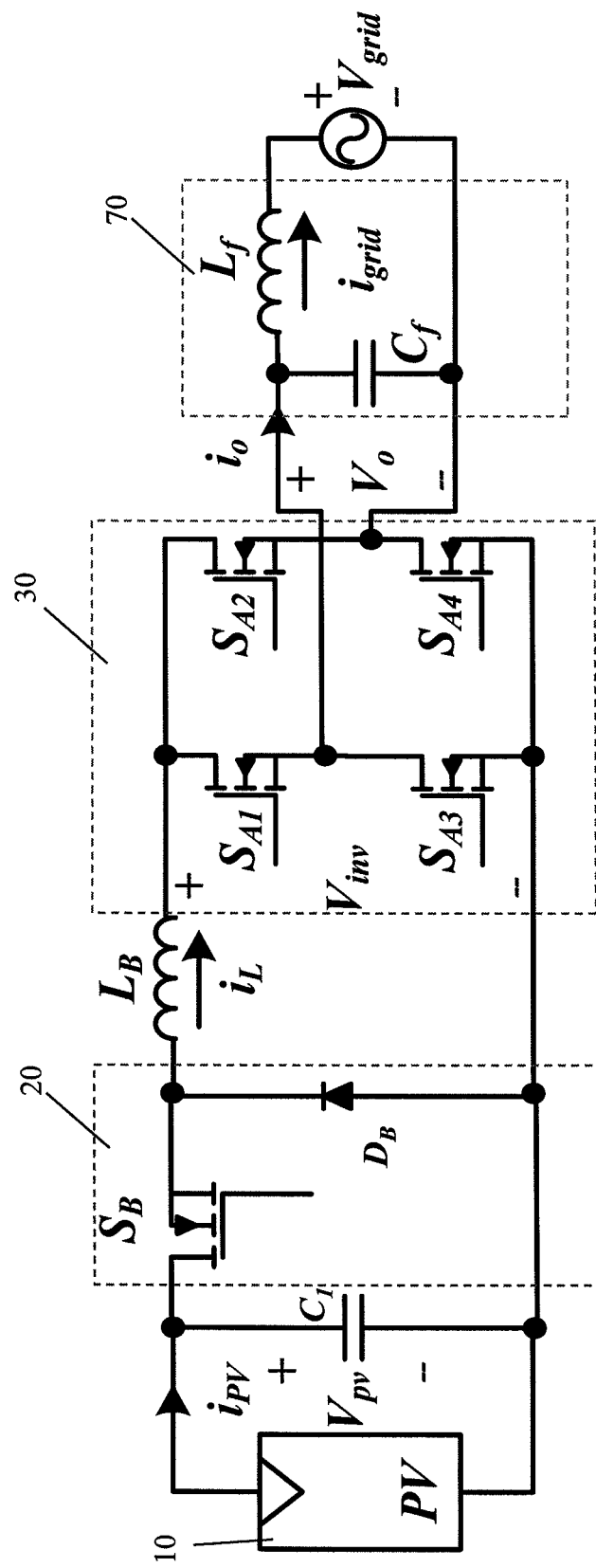
FIG. 5A is a schematic diagram of a single-string grid-connected PV cell inverter according to one embodiment.

FIG. 5A is a circuit diagram of a single-string PV cell inverter according to one embodiment. Shown is the PV cell string 10, the MPP tracker 20, a current source inverter 30, and a low pass filter 70 including Cf and Lf to eliminate output current high frequency components. The low pass filter 70 may be replaced by higher order filters for a further reduction in the size of the passive components.

Figure 5B:
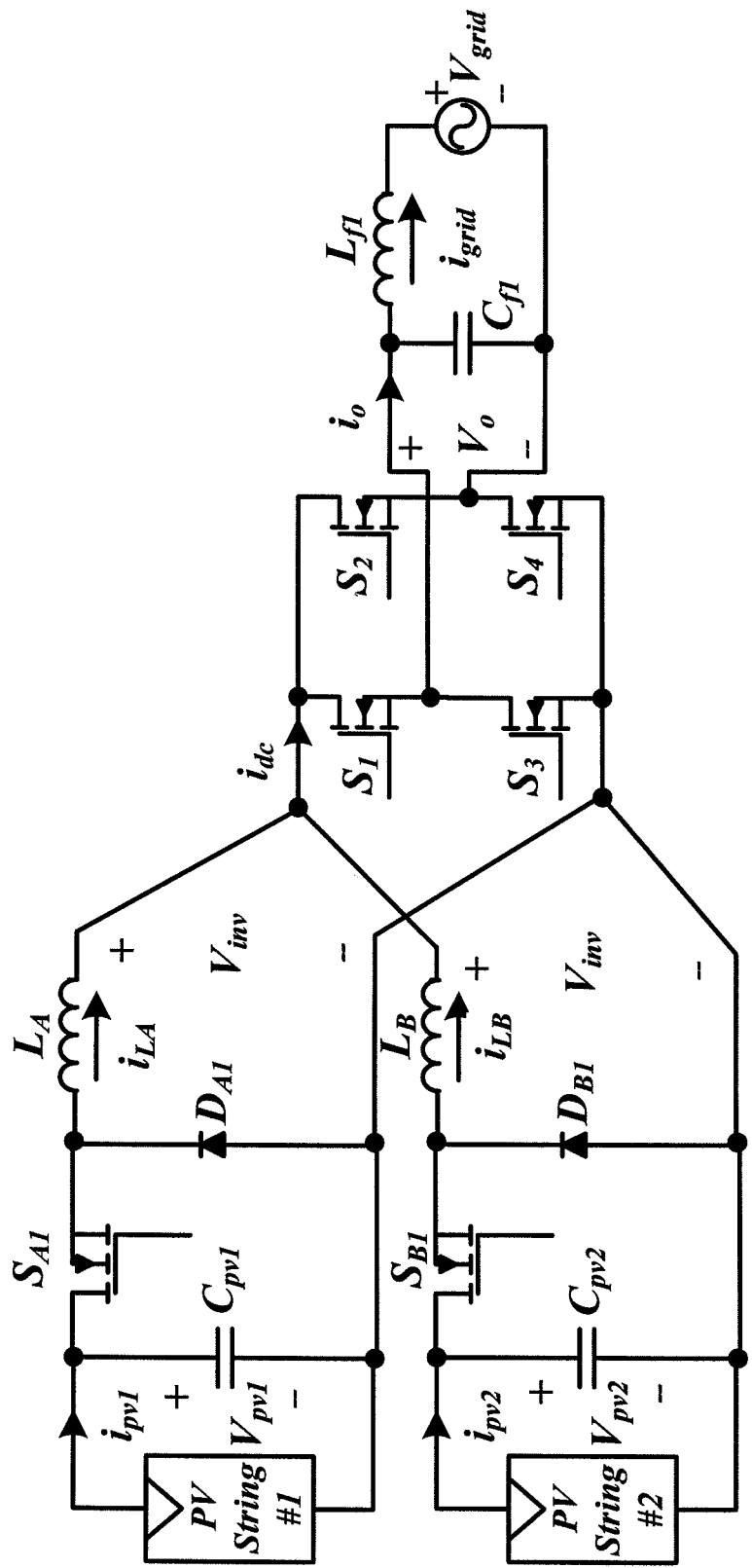
FIG. 5B is a schematic diagram of a multi-string grid-connected PV cell inverter based on the single-string embodiment of FIG. 5A.

FIG. 5B shows a circuit diagram of a multi-string PV cell inverter according to another embodiment. This embodiment is based on the circuit of FIG. 5A, but includes two MPP tracker power circuits, and two strings of PV cell modules. However, any number of power circuits and PV cell strings may be used. In the first stage the MPP trackers are connected in parallel, and each MPP tracker is connected to a PV cell string. The second stage includes a current source inverter, which is connected to the distribution grid. With this embodiment of the control algorithm a voltage source inverter may be used instead of the current source inverter, if a small capacitor is used at the input of the voltage source inverter.

Figure 6:
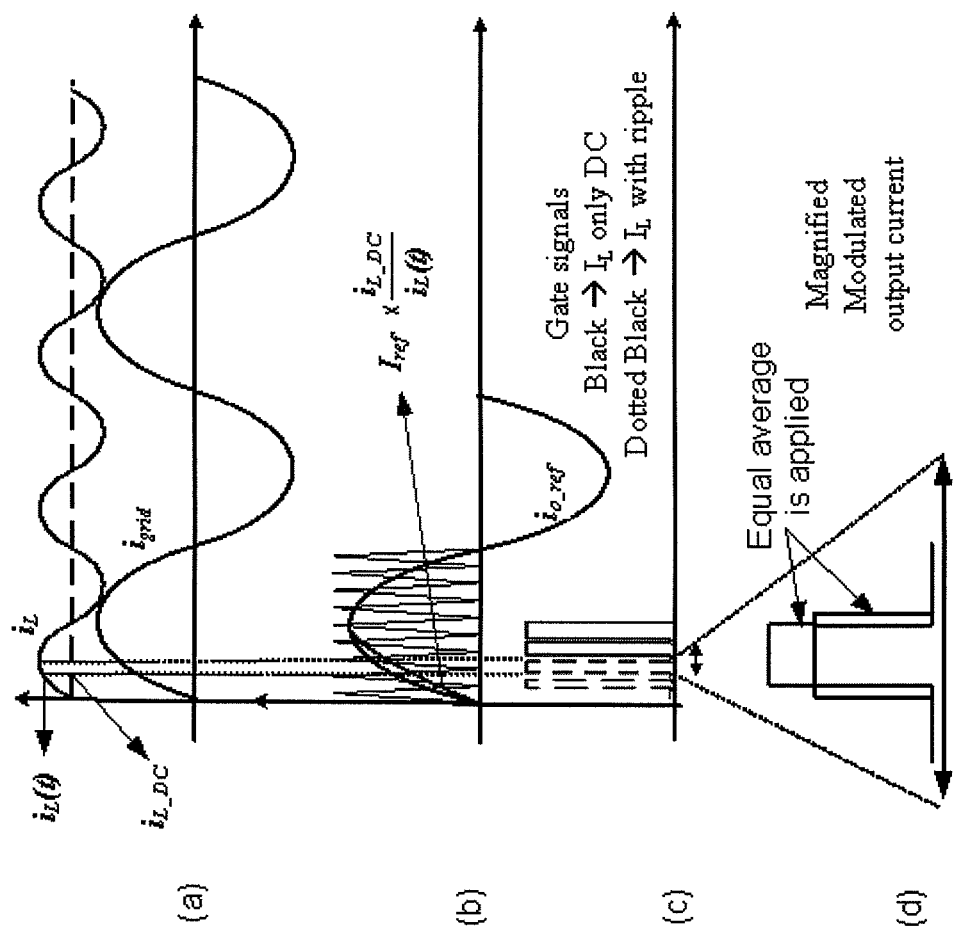
FIG. 6 shows an embodiment of a modified pulse width modulation technique used in the controller for the current source inverter of the embodiment shown in FIG. 5A or 5B.

In one embodiment, the controller for the current source inverter uses a PWM scheme. To understand the principle of operation, first assume that the current source inverter is fed by a dc current source and the PWM scheme modulates a sinusoidal reference waveform to generate a sinusoidal output current, as shown in FIG. 6. As a result of the PWM strategy the voltage induced at the input of the current source inverter is the modulated grid voltage, full-wave rectified, $V_{inv}$, as shown in FIG. 4A. However, the input of the current source inverter stage is connected to the MPP tracker output, which is not a constant current source. Thus, the input current of the current source inverter changes according to the induced voltage as discussed above. Oscillation induced in the inductor current is inevitable because the input power generation is kept constant by the MPP tracker circuit, but the output power oscillates at twice the grid frequency and thus, the power oscillation has to be supplied from an energy storage component, such as the inductors of the MPP tracker circuits. Therefore, the PWM technique may be modified to generate a pure sinusoidal waveform based on the oscillatory input current source. In one embodiment, shown in FIG. 6, this is accomplished by formulating the inductor current, and then modifying the reference signal to the PWM modulator so that it regulates and controls the dc component of the inductor current $i_L$, and prevents the double frequency harmonic component of $i_L$ from appearing in the output ac current.

Inductor DC Current Regulation

Inductor current regulation will now be described with respect to PV string #1 of FIG. 5B. Assume that the converter is lossless ($P_{in}=P_{avgo}$) and the output filter energy storage is negligible. Also, assume that there is only one PV cell string (string #1) connected to the circuit. Therefore, the only energy storage component is $L_A$. As discussed above, the MPP tracker circuit extracts constant power from the PV cells. Assuming that the current source inverter generates a current in-phase with the grid voltage, the output power may be derived as follows:

$$i_o(t) = I_o\sin(\omega t), v_o(t) = V_o\sin(\omega t) \Rightarrow p_o(t) = \frac{1}{2}V_o I_o(1-\cos(2\omega t)) \Rightarrow \quad (2)$$

$$P_{in} = P_o^{avg} = \frac{1}{2\pi}\int_0^{\frac{2\pi}{\omega}} p_o(t)\,dt = \frac{1}{2}V_o I_o$$

At $$t = \pm\frac{\pi}{4\omega},$$

we have po(t)=$P_{in}$, and if $$t \in \left(-\frac{\pi}{4\omega}, \frac{\pi}{4\omega}\right),$$

the input power will be greater than the output power. Therefore, for this time period the inductor $L_A$ will be charged from $IL_{Amin}$ to $IL_{Amax}$:

$$\frac{1}{2}L_A I_{L_A max}^2 - \frac{1}{2}L_A I_{L_A min}^2 = \int_{-\frac{\pi}{4\omega}}^{\frac{\pi}{4\omega}} (P_{in} - p_o(t))\,dt = \frac{P_{in}}{\omega} \Rightarrow \quad (3)$$

$$\Delta I_L A = \frac{P_{in}}{2\omega L_A \bar{I}_{L_A}}, \bar{I}_{L_A} = \frac{I_{L_A min} + I_{L_A max}}{2} \quad (4)$$

Since the inductor current is equal to its dc value at t=0, using a similar procedure as described above the inductor current as a function of t may be derived as follows:

$$i_{L_A}(t) = \sqrt{\bar{I}_{L_A}^2 + \frac{1}{2\omega L_A}V_o I_o \sin 2\omega t} \quad (5)$$

With reference to FIG. 6, control of the inductor dc component using the modulation index of the PWM may be explained as follows. By reducing the modulation index the output current is reduced temporarily. Consequently, the output power decreases and the difference energy is stored in the inductor which in turn increases its dc value. As a result, the output current increases up to the point where the average power injected into the grid equals the input power.

To reduce the conduction losses and to obtain a flatter efficiency curve, the inductor dc current may be minimized by the modulation index for different input power levels. Equations (4) and (5) show that oscillation of the inductor current depends on the input power, the inductor value, and the inductor dc current. Thus, as the inductor dc current decreases, $\Delta I_L$ increases, which eventually results in a discontinuous mode of operation where the output current becomes distorted.

To avoid this mode of operation, the minimum of the inductor current should be higher than the maximum output current when the second stage is, for example, a voltage boost inverter or a step down current source inverter. If a voltage source inverter is utilized at the second stage the oscillations will occur at the voltage of the inverter input capacitor. To avoid a discontinuous mode of operation the capacitor voltage should be larger than the grid voltage, and a similar approach may be used to derive equations for this mode of operation. Thus, the following inequality has to be satisfied:

$$I_{Ldc} - \Delta I_L \geq I_o = \frac{2P_{in}}{V_o} \Rightarrow \quad (6)$$

$$I_{Ldc} \geq \frac{P_{in}}{V_o} + \sqrt{\frac{P_{in}^2}{V_o^2} + \frac{P_{in}}{2\omega L}} \quad (7)$$

Figure 7:
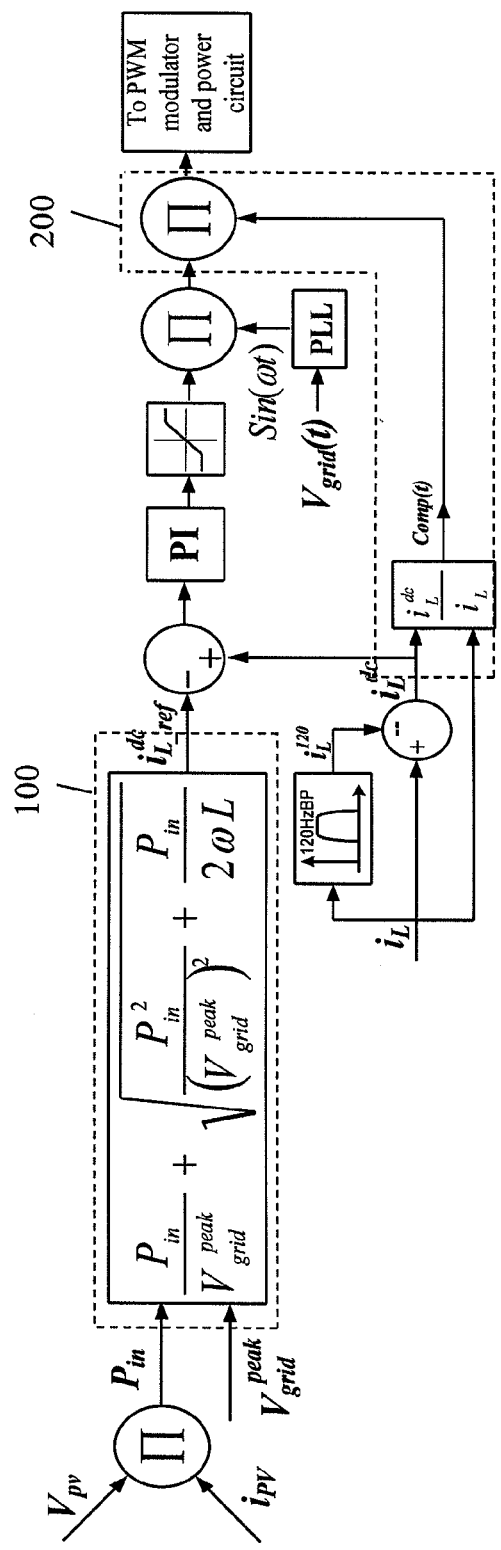
FIG. 7 is a block diagram of a control scheme for a single-string inverter according to one embodiment, showing control of the modified pulse width modulation technique of FIG. 6.
Figure 7:
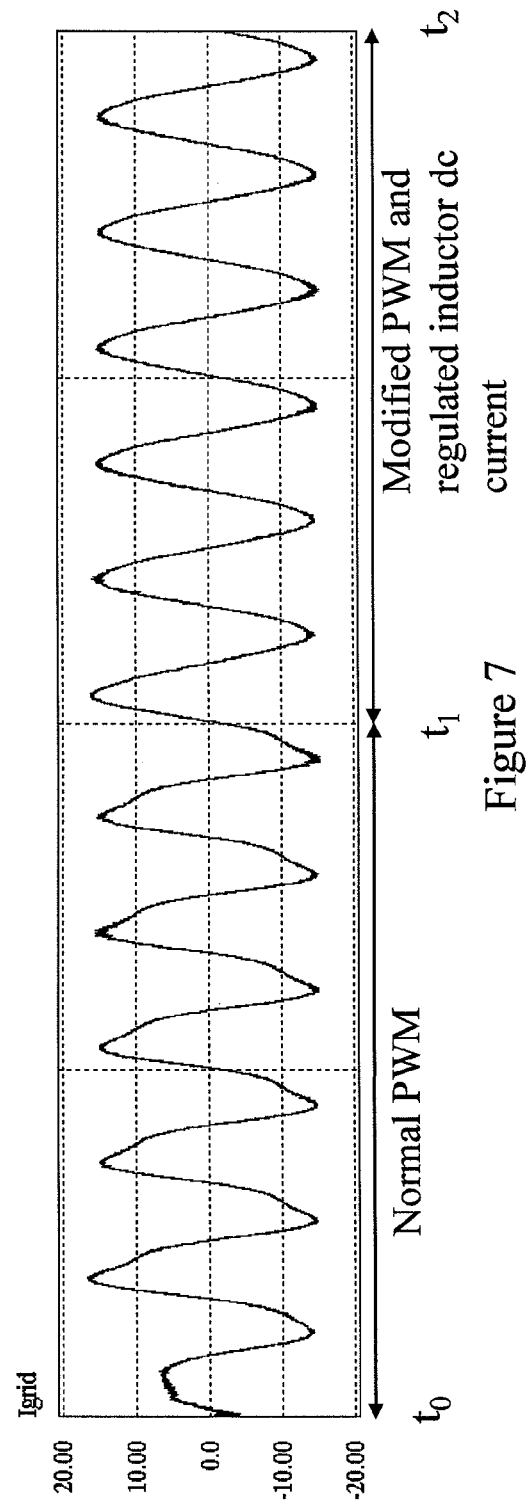
Figure 9:
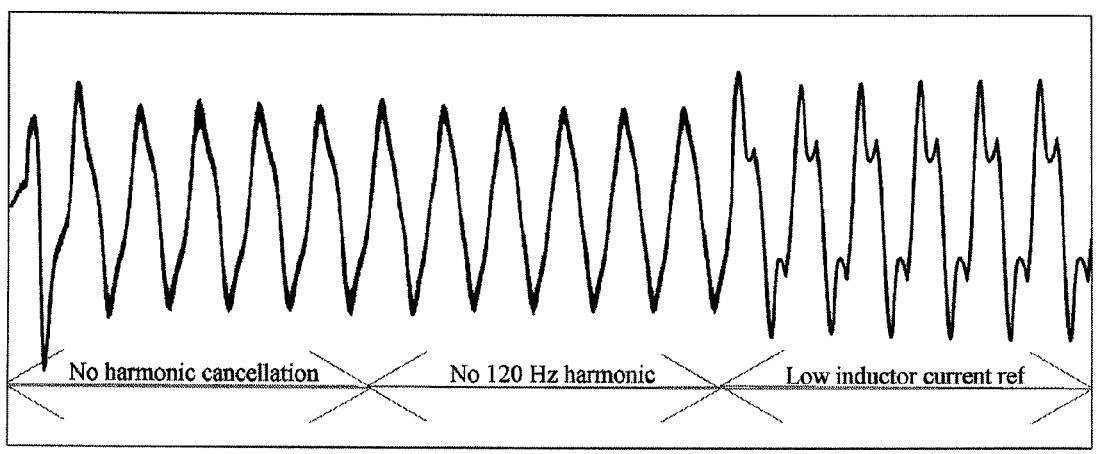
FIG. 9 is a plot showing output grid current with no harmonic cancellation and a 120 Hz harmonic, then harmonic cancellation, and finally with a low inductor current reference.

The right hand side of the inequality forms the reference inductor current. FIG. 7 shows an example of the case when the reference current is too low and the grid current is distorted (see FIG. 9; low inductor current reference). Since the minimum possible inductor current is desired, the equality may be used in the controller system to generate a reference signal for the inductor dc current, as shown in FIG. 7, time interval ($t_1$–$t_2$).

Figure 8:
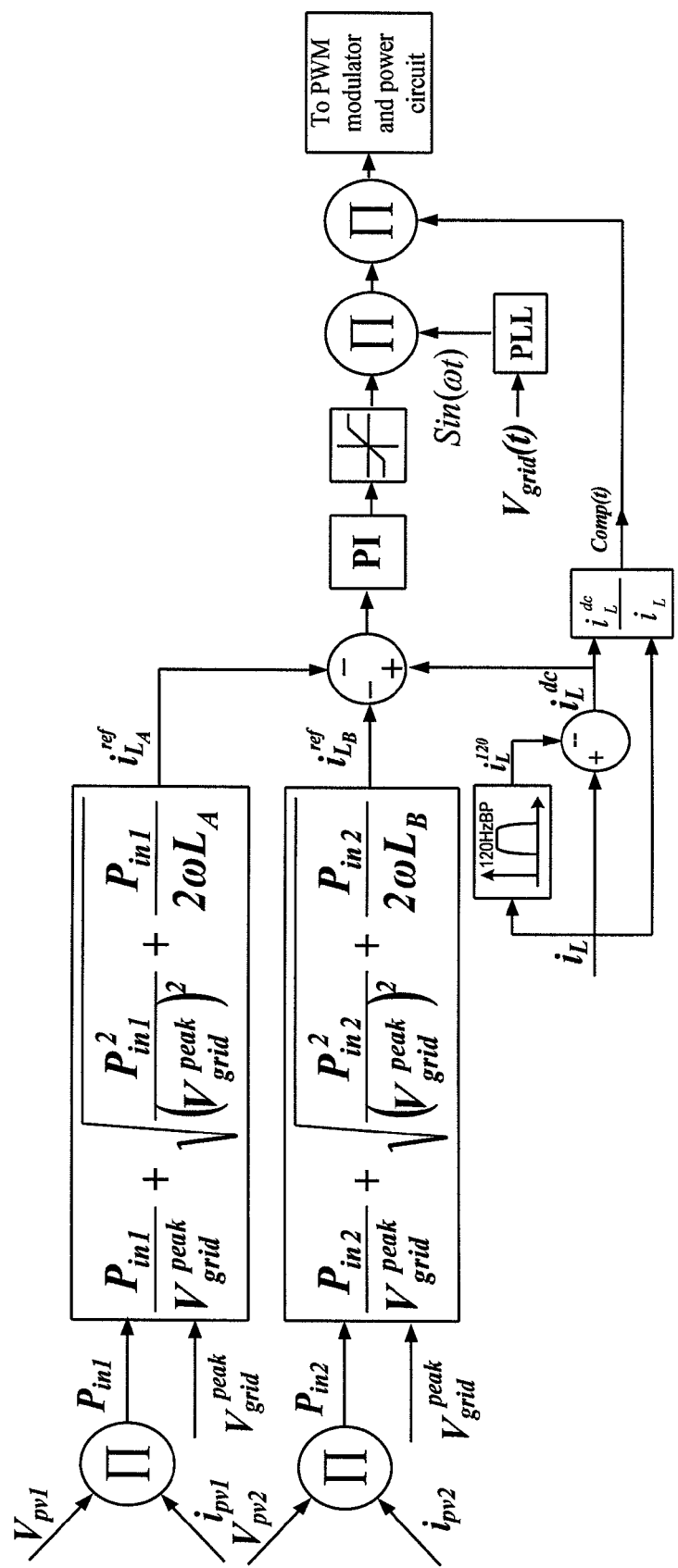
FIG. 8 is a block diagram of a control scheme for a multi-string inverter based on the embodiment of FIG. 7.

FIG. 7 shows a block diagram of an embodiment of the current source inverter control system, which consists of two parts: a proportional integral (PI) controller 100 to stabilize the inductor dc current level and prevent discontinuous modes of operation; and a compensator 200 that modifies the PWM reference signal to cancel harmonics at the grid current. To form the feedback loop, first the dc inductor value is measured and then the error signal is fed into the PI controller. The output of the PI controller adjusts the amplitude of the output current reference signal. When the error signal is positive, the inductor dc current is higher than the reference and has to be reduced. In this case the PI controller increases the reference PWM signal and consequently the output current and power increase. This, in turn, decreases the inductor current until the error signal is zero where the output of the PI controller remains constant. The case where the error signal is positive is similar. Since a PI controller is used, the steady state error will be zero and as a result, according to equation (7), the inductor current is always minimized to optimize conduction losses and also to ensure that the output current will not become discontinuous. When there is more than one PV cell string connected to the circuit, the output power equals the sum of the input powers. Thus, the output current may be decomposed into components corresponding to each string, for example, $i_o(t)=i_{o1}(t)+i_{o2}(t)$. However, the charging and discharging of each inductor depends on the difference between the power generated by a string and the power injected to the system from that string. Therefore, equations (2), (4), and (5) hold true for any number of PV cell strings j, if $i_o$, $p_o$, $P_{in}$ and $L_A$ are substituted by $i_{oj}$, $p_{oj}$, $P_{inj}$ and $L_X$. If the inequality (6) is satisfied for each string for any condition, the sum of the inductors' currents will be larger than the maximum output current. The reference current for each string is calculated and added together to form one reference inductor current and as a result, the control strategy shown in FIG. 7 regulates the dc inductor current of all strings. An embodiment for a multi string inverter is shown in FIG. 8.

A feature of this multi-string topology embodiment is that the output power oscillation is not supplied only by one inductor. Rather, all strings contribute to the power oscillation. As a result, with more strings, the current oscillation on each inductor is reduced and smaller inductors may be used. Moreover, because of the smaller oscillations, equation (5) results in a smaller dc reference for the inductor currents, which in turn reduces the conduction losses.

Harmonic Cancelation Method Using Modified PWM Technique

The embodiment described in the following section is based on a current source inverter (CSI). However, the method may be used to cancel an oscillation at the input of other converters, and in another embodiment a voltage source inverter (VSI) is used. The below description also applies to a voltage source inverter, the only difference being that the input source is voltage, the inductors are replaced by capacitors, and currents are replaced with voltages, and vice versa.

As shown in equation (5), the inductor current oscillates around a dc value at twice the grid frequency. Conventional sine PWM techniques assume a constant dc input current, and thus any harmonic of the input source will be reflected to the modulated output current. This problem may be avoided by introducing a compensation factor as shown in FIG. 7. When the oscillatory current source inverter input dc current increases, the compensator decreases the modulation index proportionally, which is done by the multiplication of the signal labeled comp (t) and the sine PWM reference signal as shown in FIG. 7. As a result, an increase in the dc current value is compensated by a reduction in the modulation pulse width, and vice versa. This type of compensation prevents oscillatory harmonics from appearing at the output current because the PWM modulator creates the new sine PWM reference signal at the output of the inverter and thus the energy transfer to the output is equivalent to the case where the inductor current is a constant dc current with no oscillation. The modulation signals and compensation method are shown in detail in FIG. 6. In FIG. 6(a) two cases when the inductor current is dc or oscillatory are demonstrated. FIG. 6(b) shows PWM reference and carrier signals for the above mentioned cases. As shown, the reference is modified by a factor which shows how much the inductor current has deviated from the dc level. The effect of this modification is shown in FIGS. 6(b), (c) for the interval when the inductor current is higher than the dc level. It can be observed from waveform (d) that since the current is higher, the pulse width is lower than the dc current and both waveforms transfer the same amount of energy to the output. As a result, with this modification, the case where the inductor current is oscillatory, the harmonics at the output are similar to the case where the inductor current is pure dc. As explained above this modification may also be applied to the case where the second stage is a voltage source inverter and the input voltage is oscillatory.

The following non-limiting example is provided to further illustrate the invention.

Example

Figure 10:
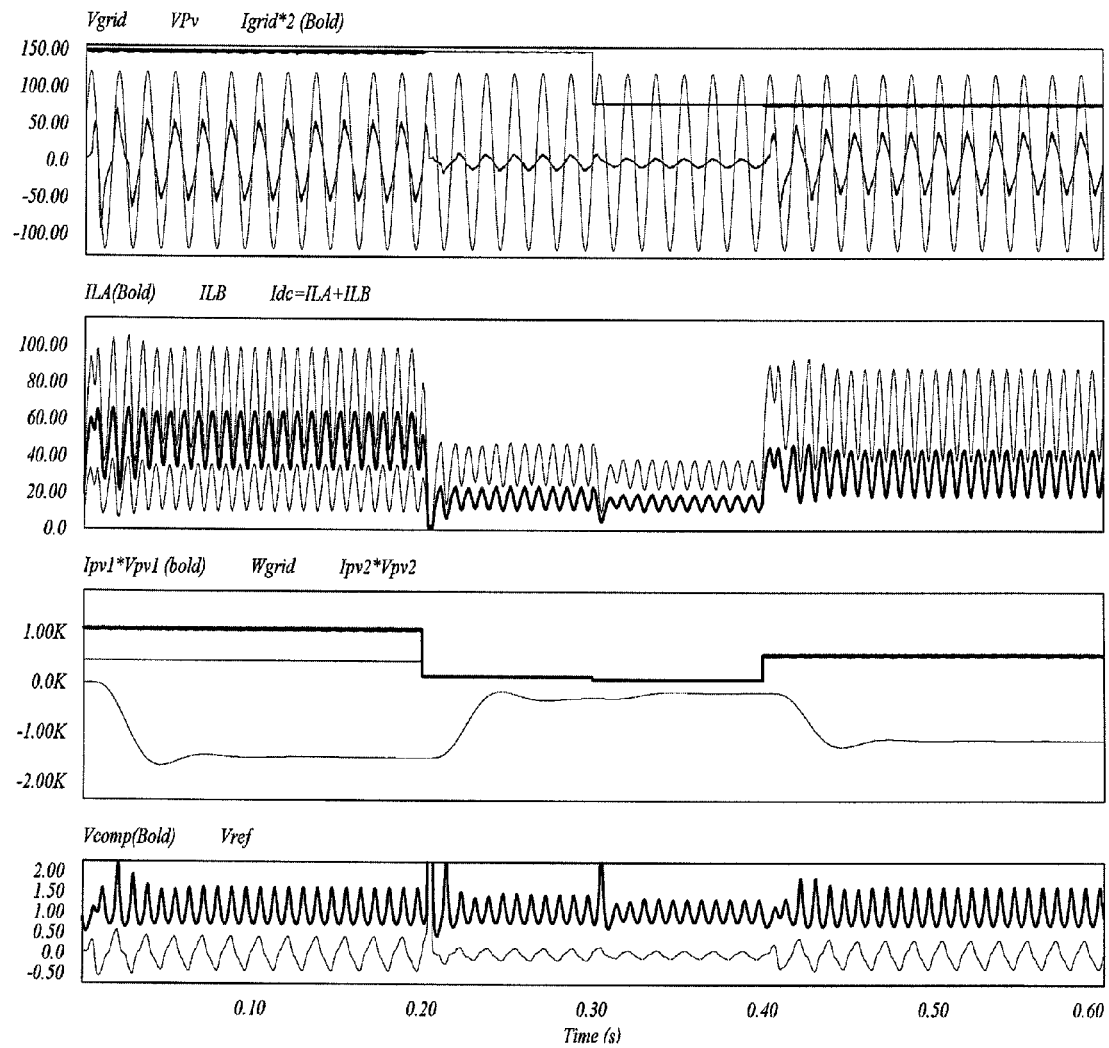
FIG. 10 is a plot showing results of a simulation of the embodiments shown in FIGS. 5B and 8, under various conditions of irradiance level, input voltage, and partial shading of the PV cells.

To demonstrate the impact of the irradiance level, input voltage level, and partial shading on the performance of a two-string PV cell inverter as shown in FIGS. 5B and 8, a simulation was carried out using PSIM 7.0 software and the values set forth in Table I, and the results are shown in FIG. 10. The system was started with string #2 partially shaded (40% of the full irradiation level) and string #1 at full power. At t=0.2 (s) both strings were partially shaded at 15% of the full irradiation level and the system response was obtained. At t=0.3 (s) the temperature of the PV cells was increased so that the output voltage of the PV cells decreased from 150V to 80V, which is less than the grid voltage. At t=0.4 (s) both strings were exposed to full irradiance. It can be seen from FIG. 10 that after each change, the controller quickly stabilized the output current. In addition, the maximum input power extraction was almost instantaneous, confirming the fast dynamic response of the MPP tracker circuit. Overall, the simulation results show that the converter is robust, and provides excellent decoupling performance for medium-power systems (such as residential applications).

TABLE I

SIMULATION PARAMETERS

| Parameters | Values |
|---|---|
| $C_{PV1}$, $C_{PV2}$ | 20 μF |
| $C_f$ | 2 μF |
| $L_A$, $L_B$ | 2000 μH |
| $L_f$ | 1000 μH |
| CSI $f_s$ | 10 KHz |
| First stage $f_s^{max}$ | 20 KHz |
| Grid voltage | 110 V |
| Grid frequency | 60 Hz |
| PV String MPP | 1.1 KW |

The contents of all references, pending patent applications, and published patents cited throughout this application are hereby expressly incorporated by reference.

Equivalents

Those skilled in the art will recognize or be able to ascertain variants of the embodiments described herein. Such variants are within the scope of the invention and are covered by the appended claims.

REFERENCES

[1] M. Meinhardt, G. Cramer, B. Burger, and P. Zacharias, "Multi-string converter with reduced specific costs and enhanced functionality," Solar Energy, vol. 69, no. 1, pp. 217-27, 2000.

[2] S. B. Kjaer, J. K. Pedersen, and F. Blaabjerg, "A review of single-phase grid-connected inverters for photovoltaic modules," IEEE Transactions on industry Applications, vol. 41, no. 5, pp. 1292-1306, Sep./Oct. 2005.

[3] G. Walker and P. Sernia, "Cascaded DC/DC converter connection of photovoltaic modules," IEEE Transactions on Power Electronics, vol. 19, pp. 1130-1139, 2004.

[4] T. Esram and P. L. Chapman, "Comparison of photovoltaic array maximum power point tracking techniques," IEEE Transaction on Energy Conversion, vol. 22, no. 2, pp. 439-449, Jun. 2007.

[5] Y. Xue, L. Chang, S. B. Kjaer, J. Bordonau, and T. Shimizu, "Topologies of single-phase inverters for small distributed power generators: an overview," IEEE Transactions on Power Electronics, vol. 19, no. 5, pp. 1305-1314, Sep. 2004.

[6] T. Shimizu, K. Wada, and N. Nakamura, "A flyback-type single phase utility interactive inverter with low-frequency ripple current reduction on the DC input for an AC photovoltaic module system," Power Electronics Specialists Conference, pesc 02. IEEE 33rd Annual, vol. 3, pp. 1483-1488, 2002.

[7] S. B. Kjaer and F. Blaabjerg, "Design optimization of a single phase inverter for photovoltaic applications," Power Electronics Specialist Conference, PESC '03. IEEE 34th Annual, vol. 3, pp. 1183-1190, Jun. 2003.

[8] B. M. T. Ho and H. S.-H. Chung, "An integrated inverter with maximum power tracking for grid-connected PV systems," IEEE Transactions on Power Electronics, vol. 20, no. 4, pp. 953-962, Jul. 2005.

The invention claimed is:

1. A compensator, comprising:

an input that receives a signal corresponding to a voltage source inverter input voltage or a current source inverter input current and generates a compensation signal representing a deviation of the voltage source inverter input voltage or the current source inverter input current from a DC value;

an input that receives a pulse width modulation reference signal and modifies the pulse width modulation reference signal according to the compensation signal, and produce a modified pulse width modulation reference signal; and an output that provides the modified pulse width modulation reference signal to a pulse width modulator;

wherein the modified pulse width modulation reference signal controls the pulse width modulator such that a harmonic in a voltage source inverter output current or a current source inverter output current is substantially reduced;

wherein the harmonic arises from voltage source inverter input voltage oscillation or current source inverter input current oscillation.

2. The compensator of claim 1, wherein the pulse width modulation reference signal is modified in proportion to the compensation signal;

wherein the compensation signal is a ratio of average and instantaneous values of the voltage source inverter input voltage or the current source inverter input current.

3. The compensator of claim 1, wherein:

the voltage source inverter output current or the current source inverter output current is connected to a power distribution grid having a grid frequency; and wherein at least one harmonic that is substantially reduced is at a frequency that is twice the grid frequency.

4. The compensator of claim 1, wherein the compensator is connected to a circuit comprising:

a high side input point and a low side input point for connection to a distributed power generator;

a parallel input capacitor connected across the high side input point and the low side input point; and a first regulating circuit connected in parallel with the parallel input capacitor, the first regulating circuit having a high side output point connected to the voltage source inverter input so as to provide the voltage source inverter input voltage;

wherein the parallel input capacitor has a small value such that voltage source inverter input voltage oscillation is not substantially reduced.

5. The compensator of claim 4, wherein the first regulating circuit comprises:

a switch connected between the high side input point and a node;

an output inductor connected between the node and the high side output point; and a diode connected between the node and a low side output point.

6. The compensator of claim 4, wherein the first regulating circuit regulates voltage across the parallel input capacitor between a lower limit and an upper limit;

wherein the upper limit is a reference voltage and the lower limit is selected so that a switching frequency of the switch and voltage oscillation across the parallel input capacitor do not exceed selected values.

7. The compensator of claim 6, Wherein the reference voltage is obtained from a maximum power point tracking (MPPT) algorithm.

8. The compensator of claim 1, wherein the compensator is connected to a circuit comprising:

a high side input point and a low side input point for connection to a distributed power generator;

a series input inductor having a first terminal and a second terminal, the first terminal connected to one of the high side input point and the low side input point; and a second regulating circuit connected between the second terminal of the series input inductor and the other of the high side input point and the low side input point, the second regulating circuit having a high side output point connected to the current source inverter input so as to provide the current source inverter input current;

wherein the series input inductor has a small value such that current source inverter input current oscillation is not substantially reduced.

9. The compensator of claim 8, wherein the second regulating circuit comprises:
   a switch connected between the second terminal of the series input inductor and the other of the high side input point and the low side input point; and
   a diode connected in series between the second terminal of the series input inductor and a corresponding high side output point or low side output point.

10. The compensator of claim 8, wherein the second regulating circuit regulates current through the series input inductor between a lower limit and an upper limit;
    wherein the upper limit is a reference current and the lower limit is selected so that a switching frequency of the switch and current oscillation through the series input inductor do not exceed selected values.

11. The compensator of claim 10, wherein the reference current is obtained from a maximum power point tracking (MPPT) algorithm.

12. The compensator of claim 4, wherein the distributed power generator comprises a photovoltaic cell.

13. The compensator of claim 8, Wherein the distributed power generator comprises a photovoltaic cell.

14. A method for controlling a voltage source inverter or a current source inverter, comprising:
    receiving a signal corresponding to an input voltage of the voltage source inverter or an input current of the current source inverter and generating a compensation signal representing a deviation of the voltage source inverter input voltage or the current source inverter input current from a DC value;
    modifying a pulse width modulation reference signal according to the compensation signal; and
    outputting the modified pulse width modulation reference signal to a pulse width modulator;
    wherein the pulse width modulator controls a voltage source inverter or a current source inverter such that a harmonic in the voltage source inverter output current or current source inverter output current is substantially reduced;
    wherein the harmonic arises from voltage source inverter input voltage oscillation or current source inverter input current oscillation.

15. The method of claim 14, comprising modifying the pulse width modulation reference signal in proportion to the compensation signal, wherein the compensation signal is a ratio of average and instantaneous values of the voltage source inverter input voltage or the current source inverter input current.

16. The method of claim 14, comprising:
    connecting the voltage source inverter output current or the current source inverter output current to a power distribution grid having a grid frequency; and
    substantially reducing at least one harmonic at a frequency that is twice the grid frequency.

17. The method of claim 14, further comprising:
    using a first regulating circuit to provide the voltage source inverter input voltage, the first regulating circuit including:
       a high side input point and a low side input point for connection to a distributed power generator; and
       a parallel input capacitor connected across the high side input point and the low side input point; and
    selecting a small value of the parallel input capacitor such that voltage source inverter input voltage oscillation is not substantially reduced.

18. The method of claim 17, comprising:
    operating the first regulating circuit to regulate voltage across the parallel input capacitor between a lower limit and an upper limit;
    wherein the upper limit is a reference voltage; and
    selecting the lower limit so that a switching frequency of a switch of the first regulating circuit and voltage oscillation across the parallel input capacitor do not exceed selected values.

19. The method of claim 18, comprising obtaining the reference voltage from a maximum power point tracking (MPPT) algorithm.

20. The method of claim 14, further comprising:
    using a second regulating circuit to provide the current source inverter input current, the second regulating circuit including:
       a high side input point and a low side input point for connection to a distributed power generator; and
       a series input inductor connected in series with the high side input point or the low side input point; and
    selecting a small value of the series input inductor such that current source inverter input current oscillation is not substantially reduced.

21. The method of claim 20, comprising:
    operating the second regulating circuit to regulate current through the series input inductor between a lower limit and an upper limit;
    wherein the upper limit is a reference current; and
    selecting the lower limit so that a switching frequency of a switch of the second regulating circuit and current oscillation through the series input inductor do not exceed selected values.

22. The method of claim 21, comprising obtaining the reference current from a maximum power point tracking (MPPT) algorithm.

23. The method of claim 17, wherein the distributed power generator comprises a photovoltaic cell.

24. The method of claim 20, wherein the distributed power generator comprises a photovoltaic cell.

* * * * *